United States Patent [19]

Chakravorty

[11] Patent Number: 5,112,448
[45] Date of Patent: May 12, 1992

[54] SELF-ALIGNED PROCESS FOR FABRICATION OF INTERCONNECT STRUCTURES IN SEMICONDUCTOR APPLICATIONS

[75] Inventor: Kishore K. Chakravorty, Issaquah, Wash.

[73] Assignee: The Boeing Company, Seattle, Wash.

[21] Appl. No.: 442,238

[22] Filed: Nov. 28, 1989

[51] Int. Cl.⁵ .................... C25D 5/02; H01L 21/288
[52] U.S. Cl. ................................... 205/118; 156/643; 156/652; 156/659; 437/192; 437/228; 205/182; 205/223; 205/224; 205/917
[58] Field of Search ............ 204/15, 37.1, 38.4; 156/643, 652, 655, 656, 659.1; 427/96, 99; 437/187, 189, 192, 203, 228

[56] References Cited

U.S. PATENT DOCUMENTS

| | | | |
|---|---|---|---|
| 4,339,305 | 7/1982 | Jones | 156/650 |
| 4,440,804 | 4/1984 | Milgram | 427/91 |
| 4,451,971 | 6/1984 | Milgram | 29/578 |
| 4,508,815 | 4/1985 | Ackmann et al. | 430/314 |
| 4,519,872 | 5/1985 | Anderson, Jr. et al. | 156/643 |
| 4,526,810 | 7/1985 | Nesbitt | 427/98 |
| 4,532,002 | 7/1985 | White | 156/643 |
| 4,575,402 | 3/1986 | Marcoux et al. | 156/643 |
| 4,661,204 | 4/1987 | Mathur et al. | 156/656 |
| 4,661,214 | 4/1987 | Young | 204/15 |
| 4,810,332 | 3/1989 | Pan | 204/15 |

Primary Examiner—John Niebling
Assistant Examiner—William T. Leader
Attorney, Agent, or Firm—Christensen, O'Connor, Johnson & Kindness

[57] ABSTRACT

A method for fabricating conductors in dielectric trenches in a self-aligned manner. Interconnect modules with a high conductor density are achieved by using a copper-polyimide system as a versatile packaging approach. A photosensitive polyimide is applied to a substrate and lithographically patterned to form polyimide steps having a characteristic positive slope, between which are defined trenches in which the substrate is exposed. A thin electroplating seed layer is deposited over the polyimide steps and the substrate. Copper is electroplated into trenches, but does not plate onto the tops of the polyimide steps, since the electroplating seed layer at that location is not electrically connected to the electroplating seed layer in the bottom of the trenches. The electroplating seed layer on top of the polyimide steps is then removed by chemical etching, plasma machining, or ion-milling. A planar structure is eventually obtained without the use of multiple coatings of polyimide layers or any additional masking layers or lift-off layers.

46 Claims, 6 Drawing Sheets

SELF-ALIGNED PROCESS FOR FABRICATION OF INTERCONNECT STRUCTURES IN SEMICONDUCTOR APPLICATIONS

FIELD OF TECHNOLOGY

This invention relates generally to the fabrication of semiconductor devices and more specifically to a method of fabricating metal patterns in dielectric trenches in a self-aligned manner without the use of any additional masking layer or lift-off layer.

BACKGROUND OF THE INVENTION

The formation and patterning of conductive metallization layers define interconnections between various circuit elements in semiconductor fabrication. However, device circuits require fine line conductors for interconnections. Copper-polyimide systems have emerged as a versatile packaging approach for high-density interconnection requirements. This approach provides an interconnect module with a wiring density in excess of 400 lines per centimeter by fabricating copper conductor lines that are several microns wide using polyimide as a dielectric.

The conventional copper-polyimide systems fabrication process consists of depositing a thick film of copper on a substrate and patterning the film by standard lithographic techniques to form conductor lines that are a few microns wide. A polyimide layer is then spin coated onto the substrate. To provide good planarity, multiple coatings of the polyimide film are needed. Additional layers of copper-polyimide interconnect structures can be fabricated over the planarized first layer. Due to the high wiring density offered in such an interconnect structure, usually only two layers of the copper conductor lines are required to produce a functional circuit.

One drawback of the conventional process for making a copper-polyimide structure is that the high aspect ratio geometry of the conductor lines makes planarization of the overall structure very difficult. Usually, multiple coatings of the dielectric polyimide layers are required before an acceptable degree of planarization is achieved. To circumvent this limitation, an alternative fabrication technique consists of depositing and patterning a seed layer for the electroplating of copper, followed by spin coating with photosensitive polyimide. The resulting polyimide film is patterned, exposing the electroplating seed layer lying between the polyimide patterns. Copper conductor lines are then electroplated between the polyimide patterned steps, onto the seed layer. To provide a planar copper-polyimide structure, the thickness of the plated copper conductor is carefully controlled. The critical limitation of this approach is the need for photolithographic patterning of the plating seed layer and proper alignment of the patterned polyimide structure with respect to the electroplating seed layer.

SUMMARY OF THE INVENTION

It is therefore an object of the present invention to provide a new and improved technique and method for the fabrication of high-density interconnect modules using copper-polyimide as a versatile packaging approach.

It is a further object of the present invention to provide a new and improved technique and method for fabrication of high-density interconnect modules using copper-polyimide as a versatile packaging approach, which can be implemented in a self-aligned manner without lift-off of the polyimide.

It is an additional object of the present invention to provide a new and improved technique and method for fabrication of high-density interconnect modules using copper polyimide as a versatile packaging approach, which can be implemented without the use of multiple coatings of polyimide layers.

A still further object of the present invention is to provide a new and improved technique and method for fabrication of high-density interconnect modules using copper polyimide as a versatile packaging approach, which can be implemented without the use of any additional masking layers or lift-off layers.

Yet an additional object of the present invention is to provide a new and improved technique and method for fabrication of high-density interconnect modules using copper-polyimide as a versatile packaging approach, which produces several metal patterns that are several microns thick in dielectric trenches.

These and other objects and advantages of the present invention are achieved by fabrication of conductor lines by deposition of a thin electroplating seed layer on a photo-patterned photosensitive polyimide layer with characteristic positive slope and electroplating, resulting in selective metal electroplating deposition only at the areas between the polyimide steps. In addition, the photo-patterned profile and the geometry of the high aspect ratio dielectric feature (such as polyimide) are used for selective deposition of the metal features.

In one embodiment, a self-aligned process for fabrication of copper-polyimide, multi-chip modules includes the steps of: spin coating a film of photosensitive polyimide (such as Selectilux HTR-3-200 available from EM Industries, Inc.) on a substrate; patterning the polyimide film to form steps or trenches using lithographic techniques; depositing a thin layer of an electroplating seed layer using an E-beam evaporation system; partially curing the layer of polyimide by baking at an intermediate temperature; electroplating copper on the electroplating seed layer between the polyimide steps; removing the electroplating seed layer on the polyimide steps by processes such as chemical etching or ion beam milling; and fully baking the structure to obtain a planar structure.

In the second embodiment, a self-aligned process for fabrication of copper-polyimide, multi-chip modules includes the steps of: spin coating a film of photosensitive polyimide on a substrate; patterning the polyimide film to form steps or trenches using lithographic techniques; depositing a thin layer of an electroplating seed layer using an E-beam evaporation system; partially curing the polyimide layer by baking; spin coating with a photoresist material to deposit a photoresist layer; baking the photoresist layer at 90°-120° C. for a short duration; etching the photoresist layer by exposing it to an oxygen-containing, or other such plasma, which etches the photoresist layer; at least partially removing the electroplating seed layer on the polyimide steps by etching; stripping the photoresist layer; and electroplating copper on the seed layer.

Other objects and advantages will become apparent to those skilled in the art upon consideration of the accompanying specification and drawings.

BRIEF DESCRIPTION OF THE DRAWINGS

The objects of the present invention and the matter of attaining them will become apparent and the invention itself will be best understood by reference to the following description of the embodiment of the invention taken in conjunction with the accompanying drawings, wherein.

DETAILED DESCRIPTION OF THE PREFERRED EMBODIMENT

Figure 1:
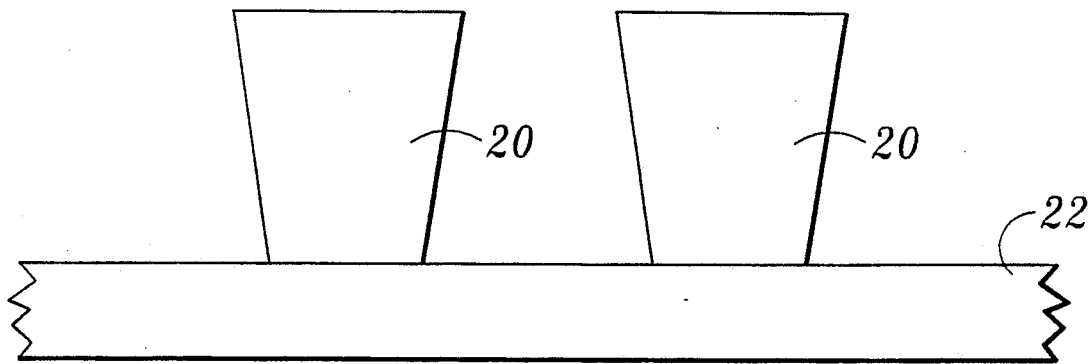
FIGS. 1 through 6 are schematic profiles, which represent the steps of the first embodiment of a self-aligned process for fabrication of copper-polyimide, multi-chip modules.

Referring to FIG. 1, a photosensitive polyimide is spin coated on a wafer or substrate 22 to provide a film thickness of about 12 microns. The polyimide is patterned using standard lithographic techniques. Typically, lithographic patterning will be performed with an exposure of 250 mJ/cm$^2$ at 406 nm (UV light), which provides polyimide steps 20 that are 13 microns wide with a pitch equal to 25 microns. Substrate 22 typically comprises silicon, but other semiconductor materials such as gallium arsenide may also be used. Attenuation of the UV light through the thick polyimide film results in underexposure of the layer near the bottom. Polyimide steps 20, having a width that is less at the bottom of the steps and a positively sloped wall profile, are obtained upon development, as illustrated in FIG. 1.

Figure 2:
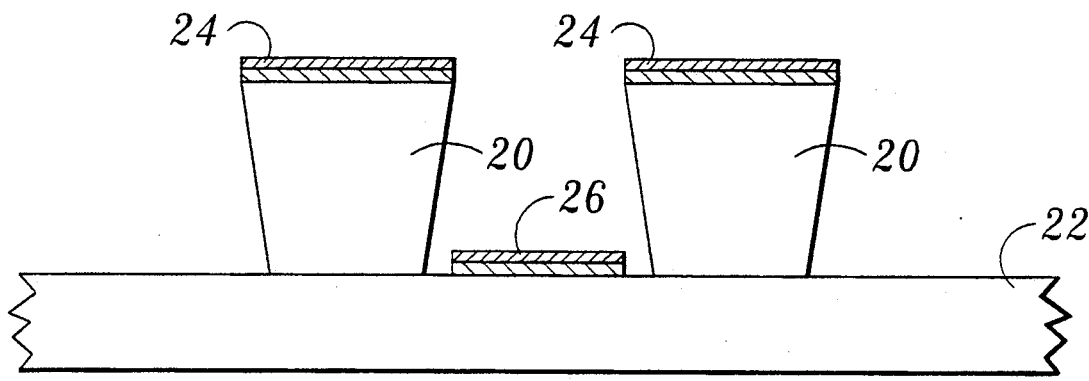

Referring specifically to FIG. 2, an electroplating seed layer 24 is shown formed on polyimide steps 20 and an electroplating seed layer 26 is shown formed on substrate 22 between the polyimide steps. Electroplating seed layers 24 and 26 are deposited using an E-beam evaporation system, which results in formation of thin layers of the electroplating material. Electroplating seed layers 24 and 26 typically comprise a combination of two different films such as titanium and copper, but other material may be used. Although for illustrative purposes the two metal films comprising the electroplating seed layers have been drawn as equal in thickness, the films can be of substantially different thickness. For instance, the titanium film, which is used to promote adhesion of the thicker copper film to substrate 22, is usually about 500 Å thick, while the copper film is typically 2000 Å thick. At best, only a poor coverage of the metal films takes place on polyimide steps 20 due to their positively sloped profile, the directional characteristics of E-beam deposition, and the large disparity between the electroplating seed layer thickness and the height of polyimide steps 20. Thus, the electroplating seed layer 24 at the top of the polyimide steps 20 is not electrically in contact with electroplating seed layer 26 on substrate 22. Therefore, electroplating seed layer 24 on the top of the polyimide steps 20 is electrically isolated from electroplating seed layer 26 on substrate 22.

Figure 3:
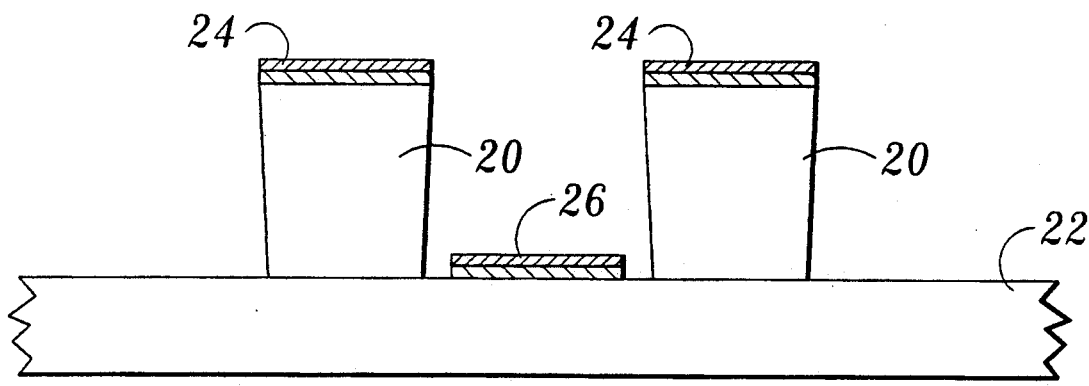

After electroplating seed layers 24 and 26 are deposited, the structure is cured by baking to a temperature of up to 250° C. As illustrated on FIG. 3, this high temperature baking causes anisotropic shrinkage and improves the sidewall profile of polyimide steps 20.

Figure 4:
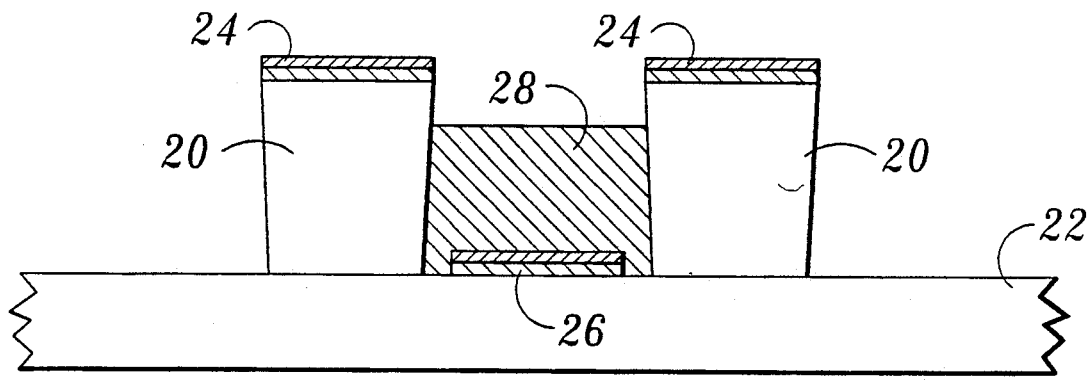

Referring now to FIG. 4, a copper layer 28 is then electroplated on seed layer 26 between polyimide steps 20 to an intermediate thickness such that after full bake of the structure at a temperature of 400° C., a planar structure results. Plated copper layer 28 also fills the area on substrate 22 between electroplating seed layer 26 and polyimide steps 20 due to the near isotropic nature of the electroplating process. Since electroplating seed layer 24 remains electrically isolated from the rest of substrate 20, the copper does not electroplate on it.

Figure 5:
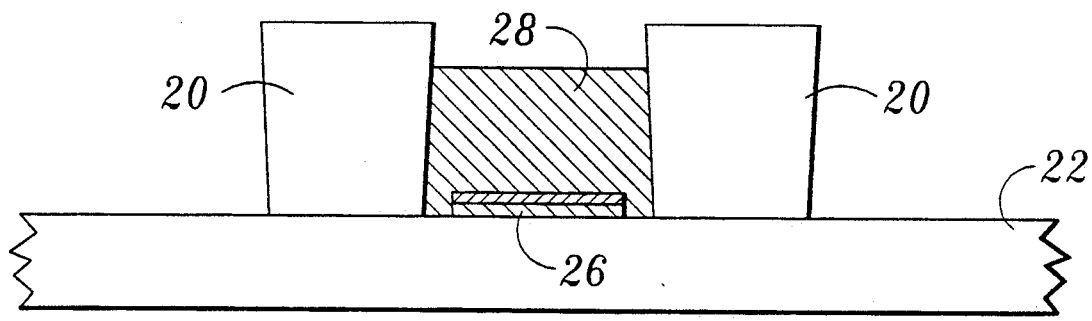
Figure 6:
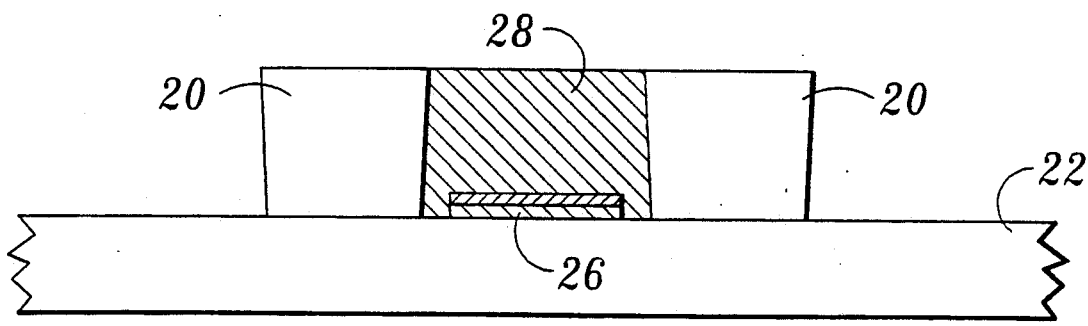

Upon completion of the electroplating process, electroplating seed layer 24 can be removed by chemically etching, which results in the structure shown in FIG. 5. Typically, the electroplating seed layer comprises two different metal films. The top film comprises a material, which electroplates copper. The other film adheres the top film to the substrate. In a particularly efficient embodiment, titanium is used as an adhesion film, but other materials, such as chromium, may also be utilized. When the electroplating seed layer comprises a combination of copper as the electroplating top film and titanium as the adhesion film, the thickness of the copper film is insignificant compared to the plated copper layer 28. Therefore, complete etching of this copper film on polyimide steps 20 will result in an insignificant reduction in the plated copper layer thickness. The remaining titanium film of the electroplating seed layer on polyimide steps 20 can be removed by selective etching over copper in acids such as dilute hydrofluoric acid. Another effective method for removing the titanium film is by reactive ion machining in a fluorine-oxygen containing plasma such as $CF_4:O_2$ or $SF_6:O_2$. Typical plasma RIE etching conditions are an $SF_6:O_2$ flow ratio of 100 ccm:10 ccm, pressure of 150 mTORR, and 200 watts of power, wherein the resultant material removal rate is approximately 150 Å/min. Alternatively, the electroplating seed layer over the polyimide steps and a similar thickness of the plated copper layer 28 can be removed by techniques such as ion-milling. The structure in FIG. 5 is then fully baked at temperatures up to 400° C. for 60 minutes to provide the planar structure of FIG. 6.

It should be noted that if the electroplating seed layer comprises a combination of a titanium adhesion film and a gold electroplating film, then chemical etching of the gold in the isolated titanium/gold films over the polyimide steps 20 cannot be carried out selectively over the copper conductor lines since the chemical etching of the gold will also cause significant etching of plated copper layer 28. In order to overcome this problem, a preferred mode of etching in this situation will be ion-milling of the thin gold layers. Utilizing this process, a comparable thickness of the plated copper layer can also be expected to etch away, but owing to the insignificant thickness involved, the loss is not critical. In general, chemical etching of the isolated electroplating seed layer will require the constituent metals to be such that the etching chemical does not etch the copper conductors at significantly higher rates than the electroplating seed layer. Additionally, electroplating of copper on the electroplating seed layer must be easily attainable.

Figure 7:
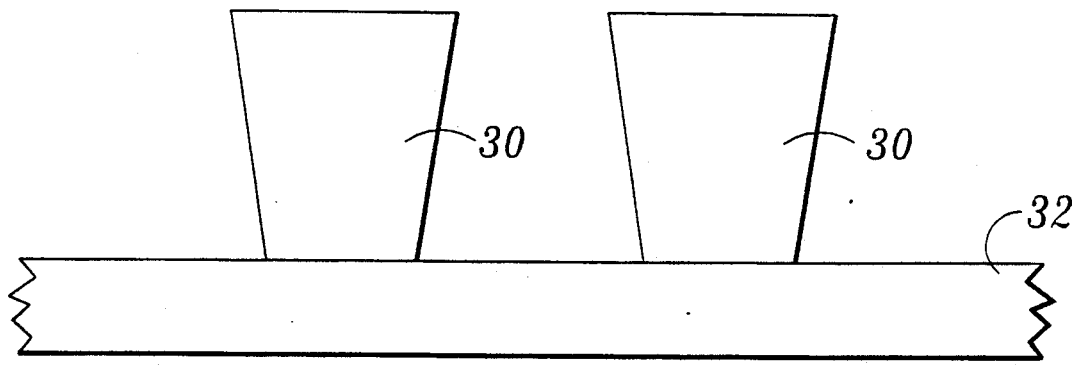
FIGS. 7 through 15 are schematic profiles, which represent the steps of the second embodiment of a self-aligned process for fabrication of copper-polyimide, multi-chip modules.
Figure 8:
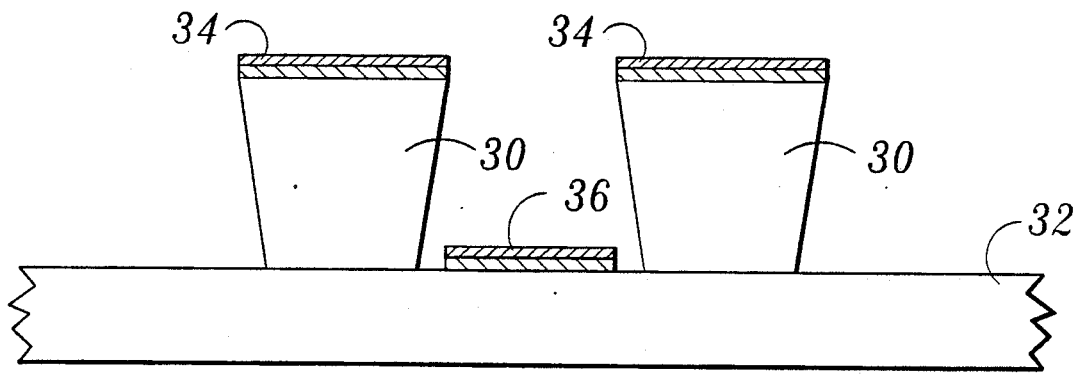
Figure 9:
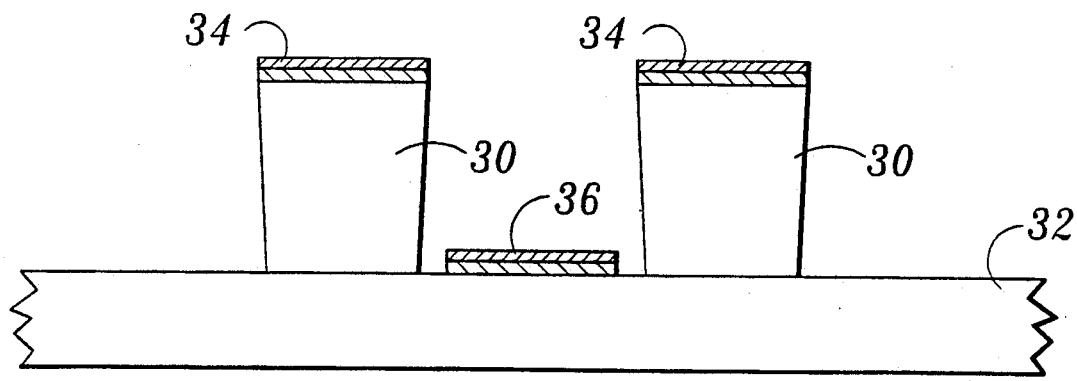
Figure 10:
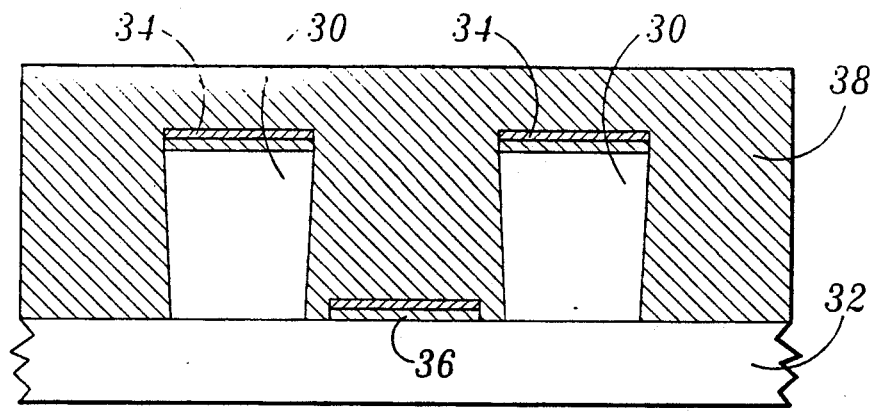

Another technique in accordance with the present invention is illustrated in FIGS. 7 through 14. In this technique, electroplating seed layers 34 and 36 may comprise a combination of two different films such as titanium and copper as in the previous approach. It may also comprise films such as gold or palladium with titanium. Steps 1 through 3, which essentially involve the deposition of electroplating seed layers between polyimide steps 30, as shown in FIGS. 7 through 9, are the same as those illustrated in FIGS. 1 through 3. In this modified approach, the substrate is then spin coated with a conventional photoresist material 38 known to those skilled in the art, as illustrated in FIG. 10. Polyimide steps 30 are almost completely planarized with photoresist material 38 after the spin coating. The thickness of photoresist material 38 in the area between polyimide steps 30 is significantly greater than over the top surface of polyimide steps 30.

Figure 11:
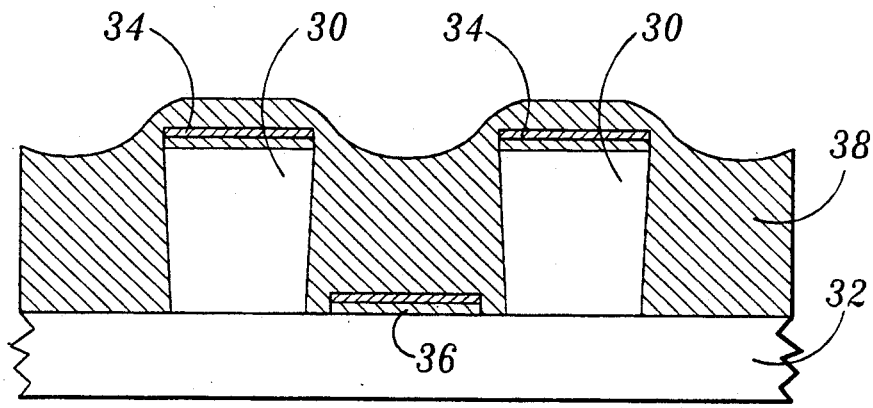
Figure 12:
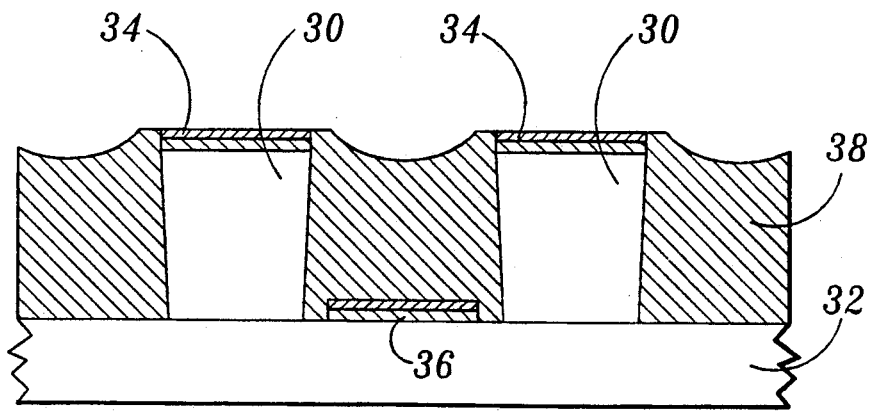

The sample is baked at 90°-120° C. for a short duration. As illustrated in FIG. 11, this baking causes shrinkage of photoresist material 38. The sample is next exposed to an oxygen-containing plasma for a duration sufficient to completely remove photoresist material 38 on the top of polyimide steps 30, as shown in FIG. 12. Alternatively, a person skilled in the art may employ other types of suitable plasma, or other techniques to remove photoresist material 38, such as wet etching, or ion-milling. The area between polyimide steps 30 still remains partly filled with photoresist material 38, and thus a thick photoresist layer covers electroplating seed layer 36 in this area. Electroplating seed layer 34 on top of polyimide steps 30 is completely exposed.

Figure 13:
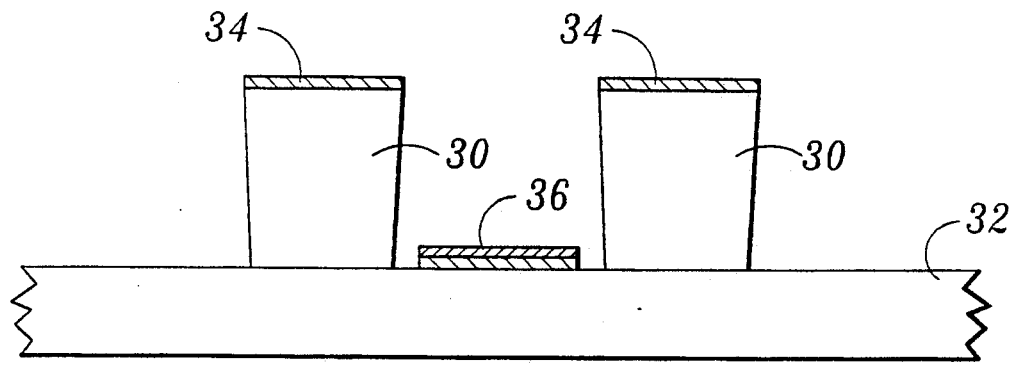

The top metal film of electroplating seed layer 34 is etched away from the top of polyimide steps 30. As illustrated in FIG. 13, photoresist material 38 is also stripped either in acetone (for a positive photoresist) or any conventional photoresist stripper. As a result, electroplating seed layer 36 remains between polyimide steps 30.

Figure 14:
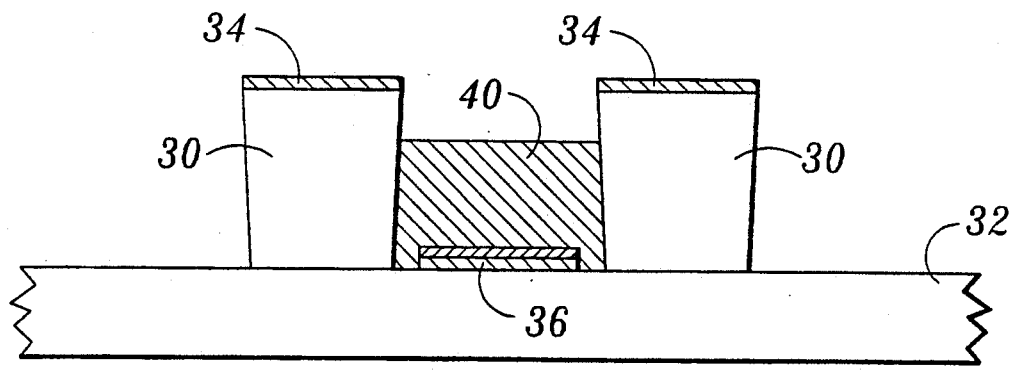
Figure 15:
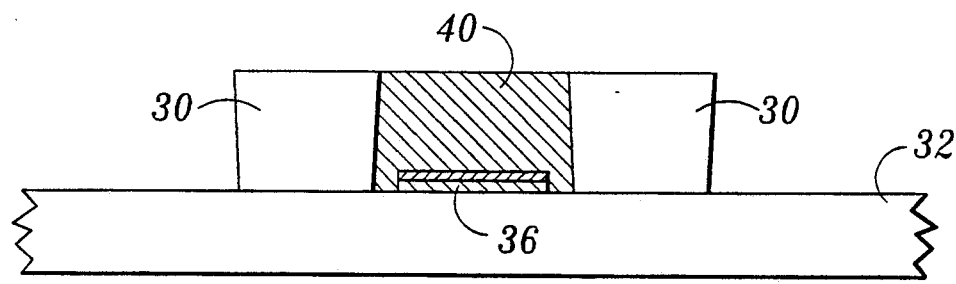

As illustrated in FIG. 14, a copper layer 40 is then plated over electroplating seed layer 36 to a thickness such that after final cure and shrinkage of the polyimide steps 30 at 400° C. for 60 minutes, a planar structure is obtained. Upon completion of the electroplating step, the titanium film is etched away from the top of polyimide steps 30 by chemical etching techniques or a reactive ion machining process, as described above. The structure is then cured for 60 minutes to provide a planar copper-polyimide interconnect structure, as illustrated in FIG. 15.

Figure 13A:
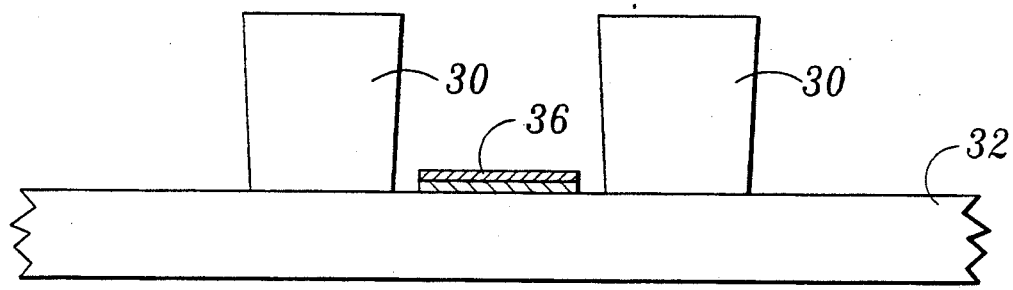

Alternatively, both metal films comprising the electroplating seed layers can be etched to remove them, as shown in FIG. 13A. If the seed layer comprises a titanium-copper combination, a 20% dilute nitric acid solution may be used for etching the copper, and either a $CF_4:O_2$ plasma, a $SF_6:O_2$ plasma, or a 6% dilute hydrofluoric acid solution may be used for etching the titanium layers. If the electroplating seed layer comprises a gold film, a nitric and hydrochloric acid mixture in a 3:1 ratio, diluted 2.25 times in DI water, may be employed. Copper electroplating is carried out over the plating seed layers in a manner identical to that illustrated in FIG. 14. The structure is then baked at 400° C. for 60 minutes so as to provide a planar structure identical to that shown in FIG. 15.

Figure 16:
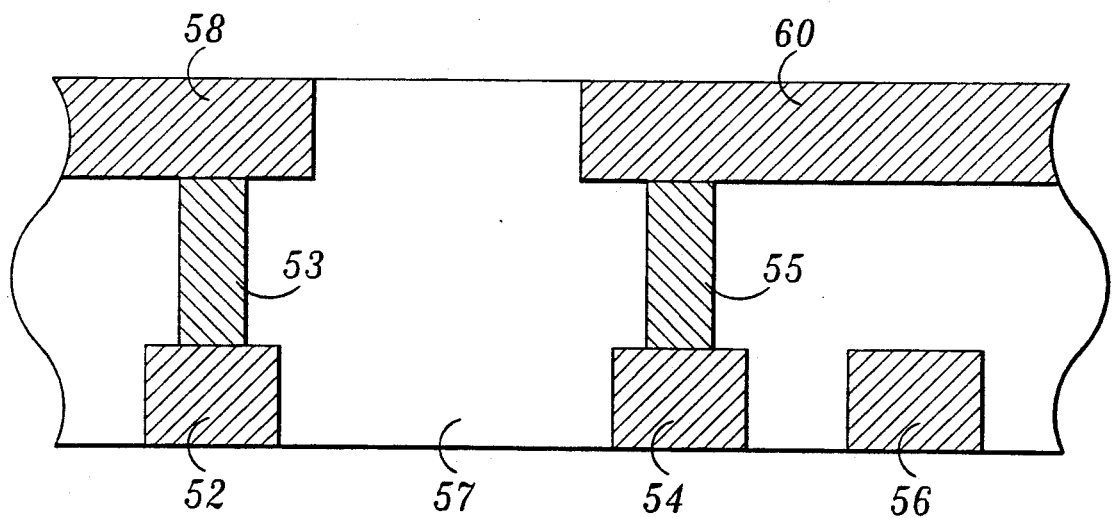
FIG. 16 illustrates the use of the present invention in conjunction with fabrication of a multi-layer interconnect structure.

Repeating the foregoing outlined approach in conjunction with U.S. Pat. No. 4,661,214 by Peter L. Young, which is hereby incorporated by reference, multi-layer interconnection structures comprising copper conductor lines and a polyimide dielectric can be fabricated. Such an interconnection structure is illustrated in FIG. 16. First layer conductor lines 52, 54, and 56 are orthogonal to second layer conductor lines 58 and 60. A via 53 electrically connects first layer conductor line 52 to second layer conductor line 58 through a polyimide layer 57. Similarly, a via 55 electrically connects first and second layer conductor lines 54 and 60. It should be noted that FIG. 16 is illustrative only and not drawn to scale. In actuality, the height of vias 53 and 55 may be less than the relative thicknesses of first and second layer conductor lines 52, 54, 56, 58, and 60.

What has been provided, therefore, is an improved technique and method for fabrication of high-density interconnect modules using copper-polyimide as a versatile packaging approach. This method is implemented in a self-aligned manner, producing metal patterns that are several microns thick without the use of multiple coatings of polyimide layers and without the use of any additional masking layers or lift-off layers.

In the first embodiment of the self-aligned process for fabrication of copper-polyimide, multi-chip modules, photosensitive polyimide is spin coated on a substrate and patterned using standard lithographic techniques. A thin electroplating seed layer is deposited on the polyimide steps and substrate using an E-beam evaporating system and partially cured by baking. A copper layer is electroplated on the seed layer, between the polyimide steps. The electroplating seed layer on the polyimide steps is then removed by chemical etching and the structure is fully baked to obtain a planar structure. The process may be repeated to create multiple layers of signal conductors.

In the second embodiment of the self-aligned process, photosensitive polyimide is spin coated on a substrate and patterned using standard lithographic techniques. A thin electroplating seed layer is deposited on the polyimide steps and substrate using an E-beam evaporation system and the layer is partially cured by baking. The substrate is spin coated with a photoresist material and baked at 90°-120° C. for a short duration. The photoresist is etched by exposure to an oxygen-containing plasma. The electroplating seed layer over the polyimide steps is either partially or completely removed by etching techniques and the photoresist material is stripped off. Copper is then electroplated on the electroplating seed layer. Any remaining film of the electroplating seed layer is removed and the structure is baked at 400° C. for approximately 60 minutes to obtain a planar structure. The process again may be repeated for each layer of a multiple layer interconnecting structure.

While specific preferred embodiments to this invention have been shown and described, further modifications and improvements will occur to those skilled in the art. For example, although in the first embodiment the structure is baked at 400° C. after the copper is electroplated on the electroplating seed layer, other temperatures that result in a planar structure may be used. Moreover, although in the second embodiment, the structure is baked at 90°-120° C. for a short duration, other temperatures and durations could be used.

Although this invention has been specifically described in respect to use of a photosensitive polyimide, the process is also applicable to any metal/dielectric system wherein metal conductors are electroplated on an electroplating seed layer between dielectric steps patterned with positively sloped walls or a profile, which leaves a gaps when an electroplating seed layer is deposited on them.

I desire it to be understood, therefore, that this invention is not limited to the particular form shown and I intend to cover all modifications that do not depart from the spirit and scope of the invention.

What is claimed is:

1. A method for forming an interconnect structure in a self-aligned manner, comprising the steps of:
   applying a dielectric film on a substrate;
   patterning the dielectric film to form a plurality of trenches that define the interconnect structure;
   depositing a thin electroplating seed layer on the dielectric film and in the trenches on the substrate, the electroplating seed layer on the substrate being electrically isolated from the electroplating seed layer on the dielectric film;
   electroplating a conductive layer on the electroplating seed layer in the trenches; and removing the electroplating seed layer on the dielectric film.

2. The method in accordance with claim 1, wherein the dielectric film comprises a polyimide.

3. The method in accordance with claim 2, wherein the polyimide is applied to the substrate by spin-coating.

4. The method in accordance with claim 1, wherein the patterning step is performed by lithographic techniques.

5. The method in accordance with claim 1, wherein the electroplating seed layer comprises a first metal film and a second metal film.

6. The method in accordance with claim 5, wherein the first metal film comprises copper and the second metal film comprises titanium.

7. The method in accordance with claim 6, wherein the first metal film has a thickness substantially greater than that of the second metal film.

8. The method in accordance with claim 1, wherein the electroplating seed layer comprises a plurality of metal films.

9. The method in accordance with claim 1, wherein during the depositing step, the electroplating seed layer is applied using an E-beam system.

10. The method in accordance with claim 1, wherein the depositing step applies the electroplating seed layer as a film that coates the bottom of the treches and surfaces of the dielectric film, said surfaces that are coated being generally parallel with the substrate.

11. The method in accordance with claim 1, further comprising the step of curing the dielectric film at a temperature sufficient to cause anisotropic shrinkage of the dielectric film, the step of curing the dielectric film occurring before the electroplating step.

12. The method in accordance with claim 1, wherein the electroplating step provides a copper layer having a thickness less than that of the dielectric film.

13. The method in accordance with claim 12, further comprising the step of heating the structure to a temperature sufficient to cause shrinkage of the dielectric film to about the same thickness of the copper layer, thereby producing a generally planar surface.

14. The method in accordance with claim 1, wherein the step of removing the electroplating seed layer is performed by chemical etching.

15. The method in accordance with claim 1, wherein the step of removing the electroplating seed layer is performed at least partially, by selective etching with an acid.

16. The method in accordance with claim 15, wherein the acid comprises hydrofluoric acid.

17. The method in accordance with claim 1, wherein the step of removing the electroplating seed layer is performed at least in part, by ion-milling.

18. The method in accordance with claim 1, wherein the step of removing the electroplating seed layer is performed at least in part, by reactive ion-machining in a fluorine-oxygen combination containing plasma.

19. The method in accordance with claim 18, wherein the fluorine-oxygen combination comprises $CF_4:O_2$.

20. The method in accordance with claim 18, wherein the fluorine-oxygen combination comprises $SF_6:O_2$.

21. The method in accordance with claim 1, wherein the interconnect structure is a multi-layer structure.

22. A method for forming an interconnect structure fabricated in a dielectric in a self-aligned manner, the method comprising the steps of:
   applying a dielectric film on a substrate;
   patterning the dielectric film to form a trench in the dielectric film;
   depositing a thin electroplating seed layer on the dielectric film and on the substrate in the trench, wherein the electroplating seed layer on the substrate is electrically isolated from the electroplating seed layer on the dielectric film;
   curing the dielectric film, thereby anisotropically shrinking the dielectric film;
   applying a photoresist layer over the dielectric film and the substrate;
   heating the photoresist layer sufficiently to cause it to shrink;
   etching the photoresist layer and thereby exposing the electroplating seed layer on the dielectric film;
   removing the electroplating seed layer from the dielectric film;
   stripping the photoresist layer; and
   electroplating a conductive layer on the electroplating seed layer, within the trench.

23. The method in accordance with claim 22, wherein the dielectric film comprises a polymide.

24. The method in accordance with claim 22, wherein the substrate comprises silicon.

25. The method in accordance with claim 22, wherein the substrate comprises gallium arsenide.

26. The method in accordance with claim 22, wherein the dielectric film comprises a polymide that is applied to the substrate by spin-coating.

27. The method in accordance with claim 22, wherein the patterning step is performed by a lithographic technique.

28. The method in accordance with claim 22, wherein the electroplating seed layer comprises a titanium film and a copper film.

29. The method in accordance with claim 28, wherein the titanium film has a thickness that is substantially less than that of the copper film.

30. The method in accordance with claim 28, wherein the step of removing the electroplating seed layer comprises the steps of:
   exposing the electroplating seed layer to a dilute nitric acid etching solution, thereby removing the copper film; and
   exposing the electroplating seed layer to a dilute hydrofluoric acid etching solution, thereby removing the titanium film.

31. The method in accordance with claim 28, wherein the step of removing the electroplating seed layer from the dielectric film is performed by exposure of the electroplating seed layer to an etching solution comprising nitric and hydrochloric acids.

32. The method in accordance with claim 28, wherein the step of removing the electroplating seed layer from the dielectric film includes the step of machining the titanium layer to remove it using a plasma comprising CF$_4$:O$_2$.

33. The method in accordance with claim 28, wherein the step of removing the electroplating seed layer from the dielectric film includes the step of removing the titanium film with a plasma comprising SF$_6$:O$_2$.

34. The method in accordance with claim 22, wherein the electroplating seed layer comprises gold.

35. The method in accordance with claim 22, wherein the electroplating seed layer comprises palladium.

36. The method in accordance with claim 22, wherein the step of depositing applies the electroplating seed layer as a film substantially coating exposed surfaces of the trench and of the dielectric film, said surfaces that are coated being generally parallel with the substrate.

37. The method in accordance with claim 22, wherein the step of depositing applies the electroplating seed layer using an E-beam system.

38. The method in accordance with claim 22, wherein the curing step is performed by heating the dielectric film to a temperature of approximately 250° C.

39. The method in accordance with claim 22, wherein the curing step occurs at 90°-120° C.

40. The method in accordance with claim 22, wherein the etching step is performed by exposing the photoresist layer to an oxygen-containing plasma.

41. The method in accordance with claim 22, wherein the step of removing the electroplating seed layer from the dielectric film is performed by exposure of the electroplating seed layer to an etching solution.

42. The method in accordance with claim 22, wherein the step of removing the electroplating seed layer from the dielectric film is performed by exposure of the electroplating seed layer to a plasma.

43. The method in accordance with claim 22, wherein the step of stripping the photoresist layer is performed with acetone.

44. The method in accordance with claim 22, further comprising the step of baking the interconnect structure after the electroplating step, to provide a planar surface on which additional layers can be applied.

45. The method in accordance with claim 44, wherein the baking step occurs at a substantially elevated temperature.

46. The method in accordance with claim 22, wherein the interconnect structure is a multi-layer structure.

* * * * *